United States Patent
Gunwani et al.

(10) Patent No.: US 8,085,603 B2
(45) Date of Patent: Dec. 27, 2011

(54) METHOD AND APPARATUS FOR COMPRESSION OF CONFIGURATION BITSTREAM OF FIELD PROGRAMMABLE LOGIC

(75) Inventors: Manoj Gunwani, Bangalore (IN); Hare K. Verma, Bangalore (IN); Cordell Prater, Sugar Hill, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 181 days.

(21) Appl. No.: 12/554,747

(22) Filed: Sep. 4, 2009

(65) Prior Publication Data
US 2011/0058431 A1     Mar. 10, 2011

(51) Int. Cl.
*G11C 7/00*     (2006.01)
(52) U.S. Cl. .......... 365/189.07; 365/189.14; 365/189.16
(58) Field of Classification Search ............. 365/189.07, 365/189.16, 189.14, 230.03
See application file for complete search history.

(56) References Cited

U.S. PATENT DOCUMENTS

| | | | | |
|---|---|---|---|---|
| 6,636,455 B2 * | 10/2003 | Maruyama et al. | ...... | 365/233.16 |
| 2008/0259695 A1 * | 10/2008 | Cho | ...... | 365/189.05 |

* cited by examiner

*Primary Examiner* — Son Dinh
(74) *Attorney, Agent, or Firm* — Hayes and Boone

(57) ABSTRACT

A memory is disclosed that can be utilized with a field programmable gate array. In some embodiments, the memory can include a memory array comprising a plurality of memory banks, each memory bank including at least one memory block, each of the at least one memory block including an array of memory cells; an address decoder coupled to each of the at least one memory block, the address decoder including a comparator coupled to receive an input address and a block address and provide a compare bit that indicates when a portion of the input address matches the block address, and an OR gate coupled to receive the compare bit and a wildcard bit, the OR gate providing an enable to the memory block when either the compare bit or the wildcard bit is asserted; and a logic unit that receives a mode value and the input address and provides the wildcard bit to each of the address decoders. Data can be simultaneously written into the memory array in patterns in accordance with the mode value. For example, in some embodiments the mode value indicates one of four patterns, a normal pattern, a block checkerboard pattern, a bank checkerboard pattern, and an all banks pattern.

27 Claims, 13 Drawing Sheets

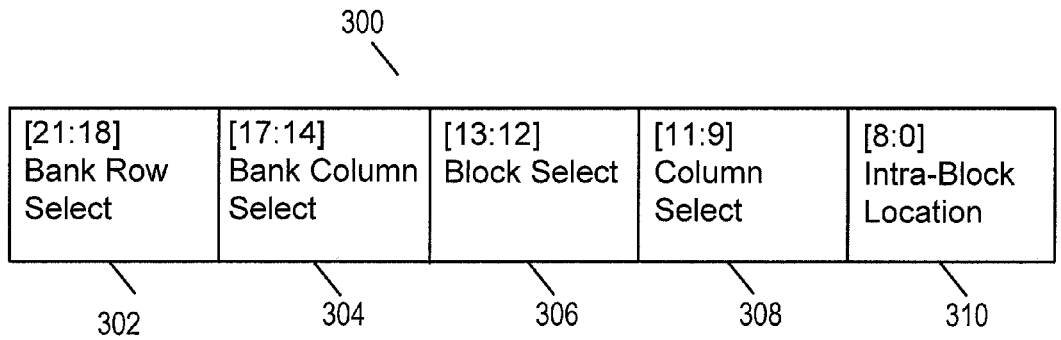

FIG. 3

| Mode Value | Pattern Indicator Bit | Function |
|---|---|---|
| 00 | - | Normal mode: The 22-bit address field determines a unique memory location for writing input data. |
| 01 | 12 | Block checkerboard mode:<br>Address bits 21:14 are ignored.<br>If address bit 12 is 0, then all SW and NE blocks are written into using Address 8:0 as intra-block locations.<br>If address bit 12 is 1, then all SE and NW blocks are written into using Address 8:0 as intra-block location. |
| 10 | 14 | Bank checkerboard mode:<br>Address bits 21:15 are ignored.<br>If address 14 is 0, then all banks at even locations are written into using Address bits 13:0 as intra-bank location.<br>If address 14 is 1, then all banks at odd locations are written into using Address bits 13:0 as intra-block location. |
| 11 | - | All banks mode:<br>Address bits 21:14 are ignored.<br>All banks are selected simultaneously, address 13:0 is used for intra-bank location |

FIG. 4

| Mode 1 | Mode 2 | Bit 12 | Bit 13 | Bit 14 | Even NW | Even NE | Even SW | Even SE | Odd NW | Odd NE | Odd SW | Odd SE |
|---|---|---|---|---|---|---|---|---|---|---|---|---|
| 0 | 0 | - |   | - | 0 | 0 | 0 | 0 | 0 | 0 | 0 | 0 |
| 0 | 1 | 0 |   | - | 0 | 1 | 1 | 0 | 0 | 1 | 1 | 0 |
| 0 | 1 | 1 |   | - | 1 | 0 | 0 | 1 | 1 | 0 | 0 | 1 |
| 1 | 0 | 0 | 0 | 0 | 1 | 0 | 0 | 0 | 0 | 0 | 0 | 0 |
| 1 | 0 | 0 | 1 | 0 | 0 | 1 | 0 | 0 | 0 | 0 | 0 | 0 |
| 1 | 0 | 1 | 0 | 0 | 0 | 0 | 1 | 0 | 0 | 0 | 0 | 0 |
| 1 | 0 | 1 | 1 | 0 | 0 | 0 | 0 | 1 | 0 | 0 | 0 | 0 |
| 1 | 0 | 0 | 0 | 1 | 0 | 0 | 0 | 0 | 1 | 0 | 0 | 0 |
| 1 | 0 | 0 | 1 | 1 | 0 | 0 | 0 | 0 | 0 | 1 | 0 | 0 |
| 1 | 0 | 1 | 0 | 1 | 0 | 0 | 0 | 0 | 0 | 0 | 1 | 0 |
| 1 | 0 | 1 | 1 | 1 | 0 | 0 | 0 | 0 | 0 | 0 | 0 | 1 |
| 1 | 1 | 0 | 0 | - | 1 | 0 | 0 | 0 | 1 | 0 | 0 | 0 |
| 1 | 1 | 0 | 1 | - | 0 | 1 | 0 | 0 | 0 | 1 | 0 | 0 |
| 1 | 1 | 1 | 0 | - | 0 | 0 | 1 | 0 | 0 | 0 | 1 | 0 |
| 1 | 1 | 1 | 1 | - | 0 | 0 | 0 | 1 | 0 | 0 | 0 | 1 |

FIG. 11

METHOD AND APPARATUS FOR COMPRESSION OF CONFIGURATION BITSTREAM OF FIELD PROGRAMMABLE LOGIC

BACKGROUND

1. Technical Field

Some embodiments disclosed herein are related to a method and apparatus for data compression and, in particular, to compression of the configuration bitstream of field programmable logic.

2. Discussion of Related Art

Field programmable logic (FPG) is capable of being programmed by the user (in the "field") using a configuration bitstream generated by a software tool. When the IC containing field programmable logic is used in a system, it utilizes a non-volatile memory to store the configuration bitstream. This non-volatile memory may be a separate memory chip, or it may be incorporated into the FPG chip. In either case, the size of the memory utilized in the system is related to the size of the expected bitstream and impacts the bill of materials (BOM) of the system.

In the case of on-chip non-volatile memory, there may be limits to the size of the memory that can be economically used. Therefore, the size of the configuration bitstream could determine the overall feasibilty of the product. The size of the configuration bitstream also impacts the speed at which the FPG can be programmed.

The speed of programming and memory sizes are also important in the context of silicon testing of the FPG IC because programmable logic, by nature, utilizes tens of bitstreams for sufficient testing coverage. The cost of a silicon test on an Automatic Test Equipment (ATE), or similar equipment, is highly sensitive to the test time and memory requirements, both of which are primarily set by the size of the configuration bitstream. A field programmable logic IC with a smaller bitstream will have a cost advantage over other systems.

Therefore, there is a need for a method of compressing and decoding data for utilization, for example, in an FPGA that reduces the size of the input data and decreases the overall write time.

SUMMARY

In accordance with some embodiments of the present invention a memory system is presented. A memory according to some embodiments of the present invention can include a memory array comprising a plurality of memory banks, each memory bank including at least one memory block, each of the at least one memory block including an array of memory cells; an address decoder coupled to each of the at least one memory block, the address decoder including a comparator coupled to receive an input address and a block address and provide a compare bit that indicates when a portion of the input address matches the block address, and an OR gate coupled to receive the compare bit and a wildcard bit, the OR gate providing an enable to the memory block when either the compare bit or the wildcard bit is asserted; and a logic unit that receives a mode value and the input address and provides the wildcard bit to each of the address decoders. Data can be simultaneously written into the memory array in patterns in accordance with the mode value. For example, in some embodiments the mode value indicates one of four patterns, a normal pattern, a block checkerboard pattern, a bank checkerboard pattern, and an all banks pattern.

In some embodiments, a method of writing to a memory array includes receiving a data value, an input address, and a mode value; and simultaneously writing the data value into memory cells of the memory array in accordance with the input address and the mode value. In some embodiments, the mode value determines a pattern from a set of patterns for writing into the memory array.

These and other embodiments are further disclosed below with reference to the following drawings.

BRIEF DESCRIPTION OF THE DRAWINGS

FIG. 3 shows a memory address consistent with some embodiments of the present invention.

FIG. 4 shows a table defining a set of modes consistent with some embodiments of the present invention.

FIG. 11 shows a logic table of the decoding logic unit shown in FIG. 10 according to some embodiments of the present invention.

DETAILED DESCRIPTION

In the following description specific details are set forth describing the embodiments disclosed herein. It will be apparent, however, to one skilled in the art that some embodiments may be practiced without some or all of these specific details. The specific embodiments disclosed herein are meant to be illustrative but not limiting. One skilled in the art may realize other material that, although not specifically described herein, is within the scope and spirit of this disclosure.

For overall design optimization, bitstream compression is one factor amongst many (e.g., frequency and power). Often, bitstream compression is balanced against other factors to optimize a particular system. Some embodiments of the present invention can deliver significant cost and performance benefits by 1) reducing the size of the non-volatile memory to store the configuration bitstream, 2) reducing the time for performance of silicon tests of the field programmable gate array (FPGA); and 3) reducing the time to reconfigure the FPGA. The ability to use a smaller bitstream delivers a cost advantage to products, especially when the memory is on-chip and relatively more expensive. Further, reducing the time for configuring the FPGA and for testing the system can produce significant performance advantages.

Figure 1:
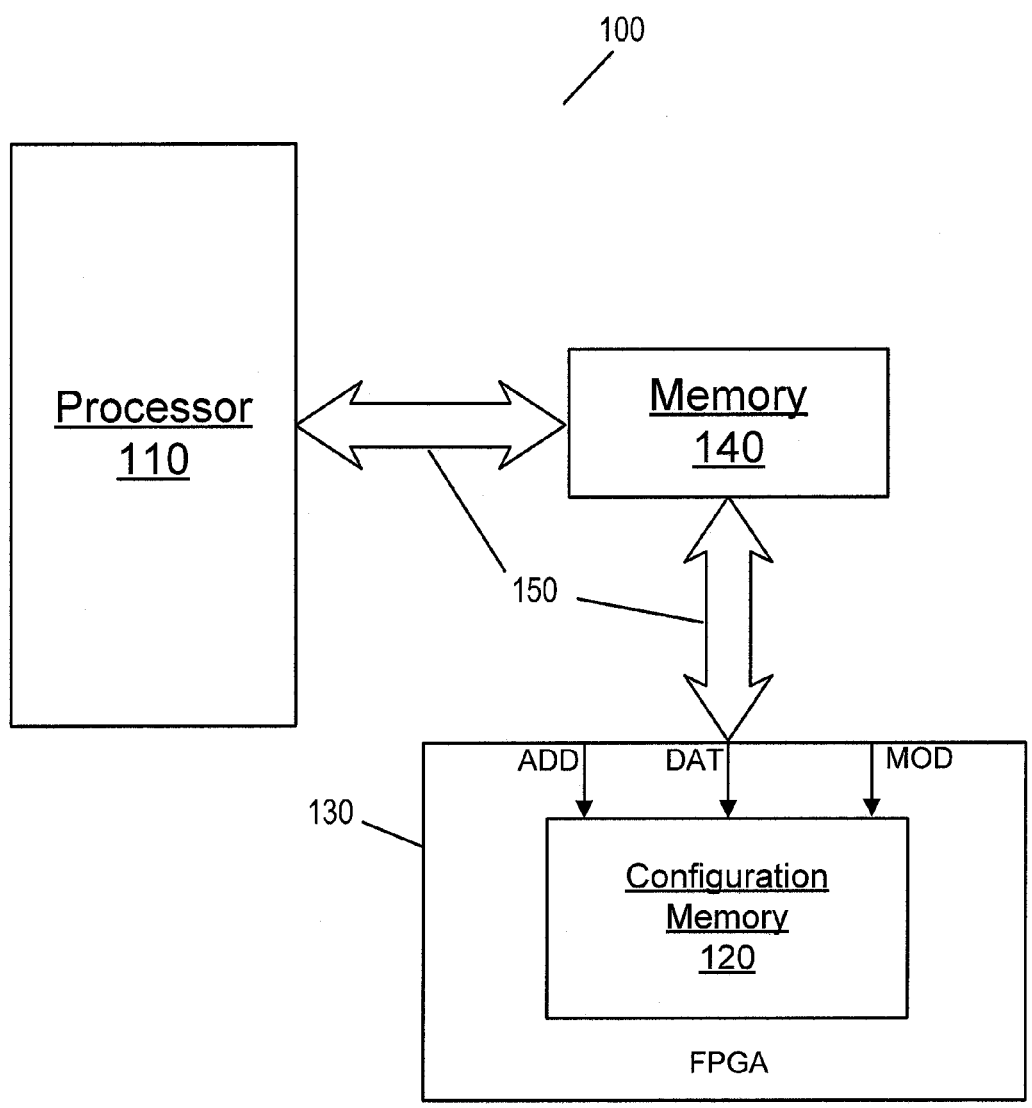
FIG. 1 shows a block diagram of a FPGA system consistent with some embodiments of the present invention.

FIG. 1 shows a block diagram of a FPGA system 100 consistent with some embodiments of the present invention. As shown in FIG. 1, FPGA system 100 includes a memory 140 and a FPGA 130. FPGA 130 itself includes a configuration memory 120. As is well known, the programmable gate arrays in FPGA 130 are configured by writing to configuration memory 120. Therefore, data written into configuration memory 120 determines the logic functions performed by corresponding sections of FPGA 130. Further, as is often the case, identical logic functions may be performed in various portions of FPGA 130. Therefore, the data written into configuration memory 120 may be patterned with identical data written into different areas of configuration memory 120, corresponding with the identical logic functions in corresponding areas of FPGA 130.

Configuration memory 120 is typically a volatile memory. Therefore, as shown in FIG. 1, a configuration bitstream 150 can be transmitted to a non-volatile memory 140 by a processor 110. Configuration bitstream 150 can then be stored in non-volatile memory 140 and the resulting data loaded into configuration memory 120 upon start-up or upon a reconfiguration user command. Non-volatile memory 140, for example, can be any memory that provides permanent storage such as FLASH or EEPROM memories. The size of memory 140 is dependent on the size of configuration bitstream 150. Reducing the size of configuration bitstream 150, then, reduces the size of memory 140. Further, reducing the size of configuration bitstream 150 results in a reduction in the load time to write configuration bitstream 150 into memory 140 as well as memory 120. In the case of a silicon test, where multiple configuration bit streams are utilized in comprehensive testing of FPGA 130, a reduction in the time to configure FPGA 130 can result in significant cost savings. Further, when memory requirements for testing are large, more expensive testing equipment is needed to perform the test.

On power-up or in response to a user command, FPGA 130 can receive and load configuration bitstream 150 that has been stored in memory 140 into configuration memory 120. As shown in FIG. 1, configuration bitstream includes an address ADD, data DAT, and a mode value MOD. In accordance with some embodiments of the present invention, a mode value is provided so that memory array 120 can be written in patterned form. The mode bus receives a mode value MOD which is used in conjunction with input address ADD to determine the memory cells selected for writing data DAT received at a data bus. When the memory chip receives certain mode values MOD, memory 120 may treat a portion of the address ADD as a pattern indicator used to enable predetermined portions of the memory array and treat another portion of the address as sub-address to select a memory cell within each enabled portion. In some modes, configuration memory 120 may also disregard a portion of address ADD. In that fashion, identical data DAT can be simultaneously written in a pattern on configuration memory 120.

Therefore, as illustrated in FIG. 1, Processor 110 generates configuration bitstream 150 and transmits configuration bitstream 150 to memory 140 for storage. Configuration bitstream 150 includes the address (ADD), the data (DAT), and the mode value (MOD). Processor 110 performs pattern identification and generates configuration bitstream 150 with, in some embodiments, much reduced size, which may utilize a much smaller memory 140 for storage. Configuration memory 120 receives the reduced sized configuration bitstream 150 and, from the address ADD and mode value MOD, writes data into configuration memory 120 appropriately to program FPGA 130.

As discussed above, with the added mode function, data DAT may be written into multiple memory cells throughout memory 120 with the same sub-address simultaneously according to the pattern specified by the pattern indicator portion of the address ADD. As a result, data created for system 100 may be compressed by grouping cells with identical data value into patterns corresponding to one of the modes and writing the data DAT into multiple memory cells simultaneously. Therefore, an input data can be compressed based on commonality of data values with respect to their location in memory 120.

As shown in FIG. 1, configuration bitstream 150, which also includes the mode, can be provided by processor 110. Software algorithms can be executed on processor 110 for generating compressed data from an original data set that describes the logic functions performed by FPGA 130. The software algorithms can create greater commonality of data values and achieve higher compression rate, in some cases vastly reducing the size of configuration bitstream 150.

Processor 110 can be any device capable of executing the software algorithm that generates configuration bitstream 150. As such, processor 110 may include memory and other data storage media and may include processors for executing software stored in that memory or on other data storage media.

Figure 2:
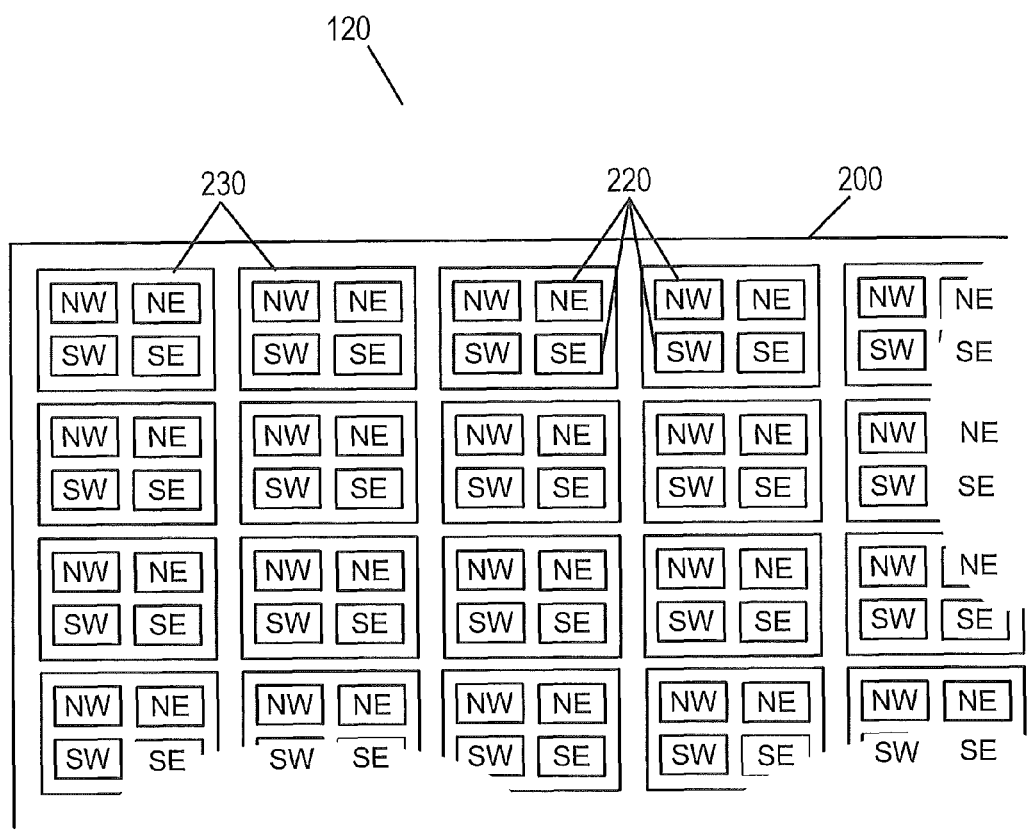
FIG. 2 illustrates a layout of a configuration memory array consistent with some embodiments of the present invention.

FIG. 2 illustrates a layout of configuration memory 120 according to some embodiments of the present invention. As shown in FIG. 2, memory 120 includes a memory array 200. Memory array 200 includes a plurality of memory banks 230, which can be arranged by row and column. Each of memory banks 230 includes an array of memory blocks 220. In the embodiment shown in FIG. 2, memory banks 230 each include a 2 by 2 array of memory blocks 220, which are labeled NW, NE, SW, and SE. Each of memory blocks 220 includes a plurality of individual memory cells (not shown). The addressing of memory array 200 is described with respect to FIG. 3.

The exemplary layout of memory 120 shown in FIG. 2 is an illustrative example only. Some embodiments may not separate the banks 230 into blocks 220, and patterns may be defined on the block level. A memory bank 230 may consist of any number of memory blocks 220 arranged in a variety of configurations, such as, for example, 1 by 4, 2 by 4, 4 by 4, 2 by 8 . . . etc. Memory blocks 220 that comprise a memory bank 230 are also not necessarily immediately adjacent to each other, nor include the same number of memory cells, but instead may be dispersed throughout memory 120 and be of arbitrary size. However, the memory layout illustrated in FIG. 2 provides a convenient example from which to describe aspects of embodiments of the present invention.

FIG. 3 illustrates a memory address string 300 indicating an address ADD, which is part of the configuration data stream, consistent with some embodiments of the present invention. As shown in FIG. 3, memory address string 300 includes the following fields: a bank row select 302, a bank column select 204, a block select 306, a column select 308, and an intra-block location 310. Column select 308 and intra-block location 310 together form a cell address field. In the particular example shown in FIG. 3, memory address string 300 includes a 22 bit length, labeled bits 21:0. As indicated, bank row select 302 is bits 21:18, bank column select 304 is bits 17:14, block select 306 is bits 13:12, column select 308 is bits 11:9; and intra-block location 310 is bits 8:0. However, memory address string 300 may be of any bit size and, additionally, bank row select 302, bank column select 304, block select 306, column select 308, and intra-block location 310 can be of any size. In some embodiments, memory address string 300 is accompanied by data DAT to be written into the address ADD indicated in memory address string 300, or in some embodiments a series of data DAT that will be sequentially written into memory array 200 starting from the address ADD indicated by memory address string 300.

In memory array 200, memory banks 230, which are arranged in rows and columns, are identified by bank row select 302, e.g., bits 21:18, and bank column select 304, e.g., bits 17:14. Block select 306, e.g., bits 13:12, identifies one of blocks 220 in FIG. 2, e.g. one of the four blocks NW, SW, NE, and SE in bank 230 indentified by bank row select 302 and bank column select 304. Internal to block 220, memory cells can be arranged in column and row order as well. Column select 308, e.g., bits 11:9 in FIG. 3, identify one of the columns in the identified block 220. Intra-block location address 310, e.g. bits 8:0, identifies a specific cell in a memory block 220 by identifying the row of cells in block 220. In some embodiments, the cell address may utilize a different addressing method than that shown in FIG. 3.

As indicated above, the address configuration shown in FIG. 3 is an illustrative example. The length of the address may vary depending on the size of memory array 200. The size of each of the portions may vary depending on the grouping of the memory cells in the memory array. For example, the block select portion may include 3 bits if there are eight blocks in each bank. The address may also consist of fewer layers of address, such as including only block select and an intra-block location portions, for example. The address may also include additional layers of address such as having an additional array select portion when a single memory chip comprises multiple memory arrays.

In accordance with some embodiments of the present invention, as shown in FIG. 1, a mode signal can be provided to memory 120 in order to reduce the size of the configuration bitstream that needs to be transmitted to memory 120. The configuration of FPGA array 130, for example, often occurs in patterns that can be mapped onto memory 120. The mode signal can be utilized to simultaneously write various patterns into memory 120, which, instead of including an individual write to each memory cell, includes a limited number of bits in configuration bitstream written simultaneously to multiple memory cells in the pattern.

FIG. 4 shows a table illustrating a set of modes consistent with some embodiments of the present invention. In the embodiment shown in FIG. 4, the mode value has two bits to accommodate four modes: '00,' '01,' '10,' and '11.' As further shown in FIG. 4, mode value '00' indicates a "normal" mode, mode value '01' indicates a "block checkerboard" mode, mode value '10' indicates a "bank checkerboard mode," and mode '11' indicates an "all banks" mode.

Figure 5:
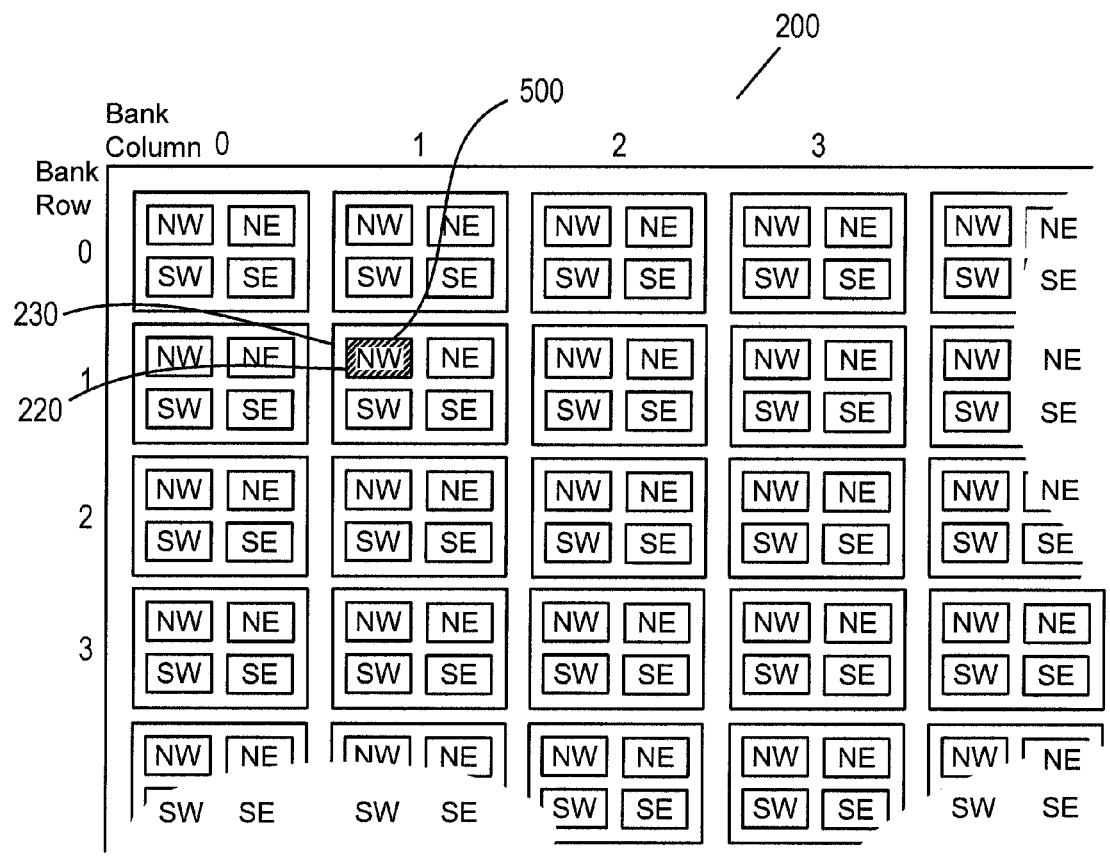
FIGS. 5-8 show a portion of a memory array illustrating operation of the modes shown in FIG. 4.

In normal mode (mode value '00'), only a memory cell having an address matching the input address ADD is written with data DAT. FIG. 5 illustrates normal mode where, in reversed color, a memory block 500 when the address ADD identified in memory address 300 identifies bank column 1, bank row 1, block NW, and the particular cells within block 500 identified by the cell address, which includes column select 308 and intra-block location 310.

Figure 6:
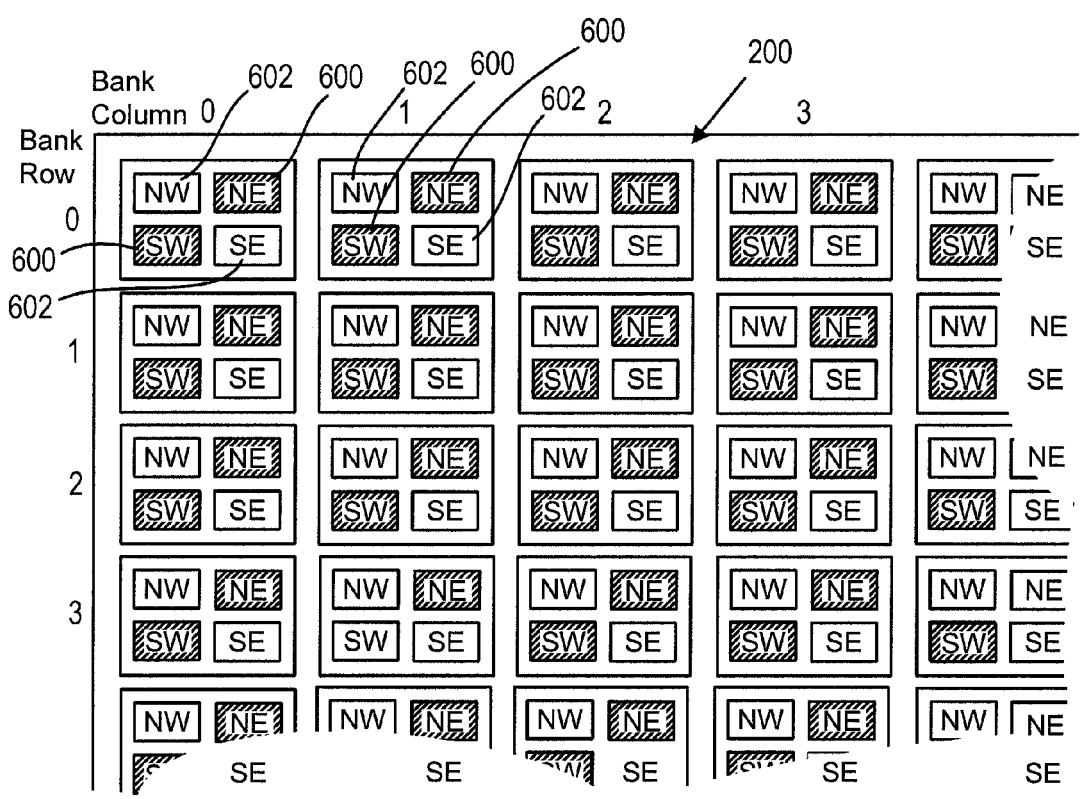

As discussed above, when the mode value is 01, the mode is "block checkerboard." This mode is illustrated in FIG. 6. FIG. 6 shows that either blocks 600 or blocks 602 are written. A pattern indicator bit, for example address bit 12, can be utilized to determine which of blocks 600 or blocks 602 are written. For example, if the pattern bit is set to 0 blocks 600 can be written into, whereas if the pattern bit is set to 1, blocks 602 can be written into. As shown in FIG. 6, the blocks selected to receive data DAT under this mode forms an alternating, or checkerboard, pattern on memory array 200. In block checkerboard mode, bank row select 302, bank column select 304, and block select 306 are ignored. As indicated above, one bit, in the example here one bit of block select 306, is utilized as the pattern indicator bit. For example, in the particular example shown in FIG. 3, address bits 21:13 are ignored and bit 12 is designated as the pattern indicator bit. Specifically, if address bit 12 is 0, all SW and NE blocks (blocks 600) in each of memory banks 230 are written into at the cell indicated by column select 308 and intra-block location 310. If address bit 12 is 1, then all SE and NW blocks (blocks 602) are written into at the cell indicated by column select 308 and intra-block location 310.

Figure 7:
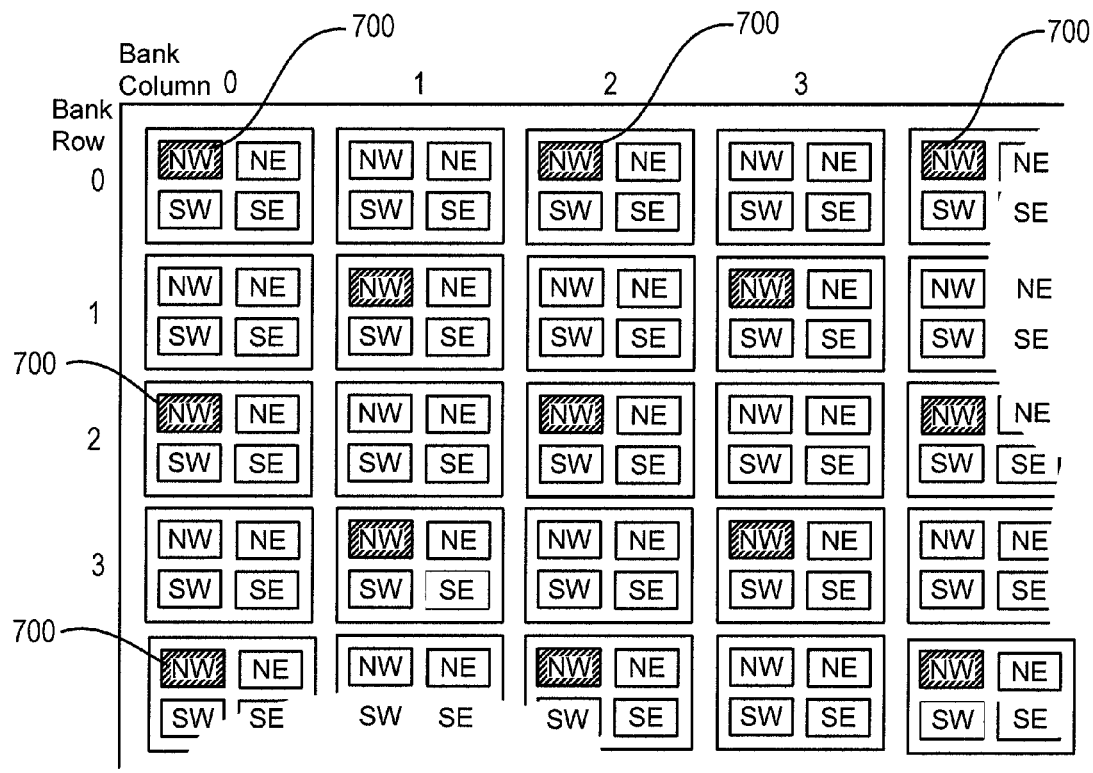

When the mode value is 10 the mode is "bank checkerboard." This mode is illustrated in FIG. 7. In bank checkerboard mode, one block in each of either the odd or even numbered banks is written. The odd numbered banks are those banks where the sum of the column and the row addresses is odd. The even numbered banks are those banks where the sum of the column and the row addresses is even.

FIG. 7 shows blocks 700, the NW block of even number banks, as being written. Bank row select 302 and bank column select 304 are ignored and one of the ignored bits can be utilized as a pattern indicator bit. For example, address bits 21:15 are ignored and bit 14 designated as the pattern indicator bit. In some embodiments, if the pattern indicator bit is 0, then all banks at even locations (the sum of the row number and the column number is even) are written with the data DAT at the location indicated by block select 306, column select 308, and intra-block location 310 (e.g., address bits 13:0) to indicate the individual cells. If the pattern indicator bit is 1, then all banks at odd locations (the sum of the row number and the column number is odd) are written with the data DAT at locations indicated by block select 306, column select 308, and intra-block location 310 (e.g., address bits 13:0). The banks selected to received data DAT under this mode forms an alternating pattern on the memory array.

Figure 8:
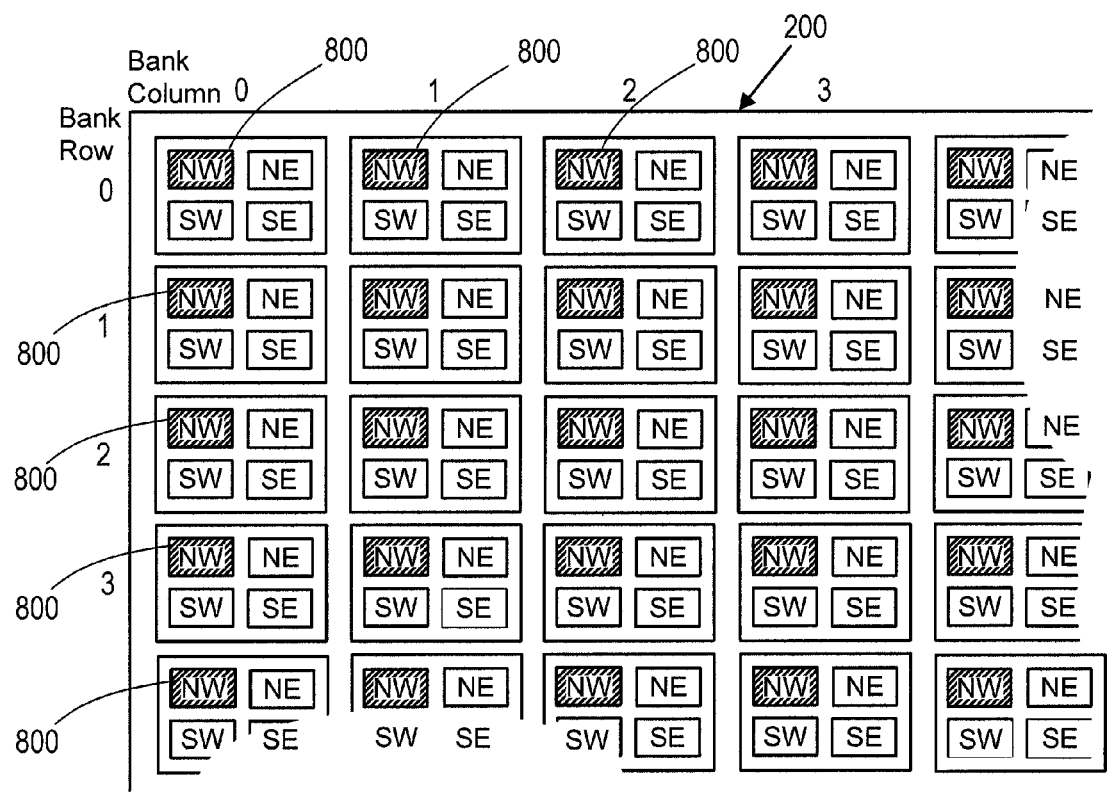

When the mode value is 11, the mode is "all banks" mode. The all banks mode is illustrated in FIG. 8, where blocks 800 in every one of banks 230 are written. In this case, bank row select 302 and bank column select 304 (e.g. address bits 21:14 shown in FIG. 3) are ignored. In the all banks mode, all memory cells in each of banks 230 with the indicated block select 304, column select 308, and intra-block location 310 address are written with data DAT The modes illustrated in FIG. 4 are illustrative examples only. The mode bus may consist of more or fewer bits allowing more or fewer patterns to be utilized. The modes may also utilize different portions of the input address ADD as pattern indicator bits, or use more bits to indicate particular patterns. The patterns determined by the mode MOD and pattern indicator portion of the address ADD may also vary without departing from the spirit of the present embodiment. For example, address bit 12 having the value 0 may select even or odd block columns or even or odd block rows instead of selecting a checkerboard pattern. Additionally, a different set of patterns may be chosen.

System 100 shown in FIG. 1 allows configuration bitstream 150 (which includes both address ADD 300 and data DAT) to be reduced in size relative to the amount of data written into memory array 200. FIG. 9 A-C illustrate various patterns that can be formed utilizing the modes shown in FIG. 4, memory array 200 shown in FIG. 2, and the address ADD shown in FIG. 3.

Figure 9A:
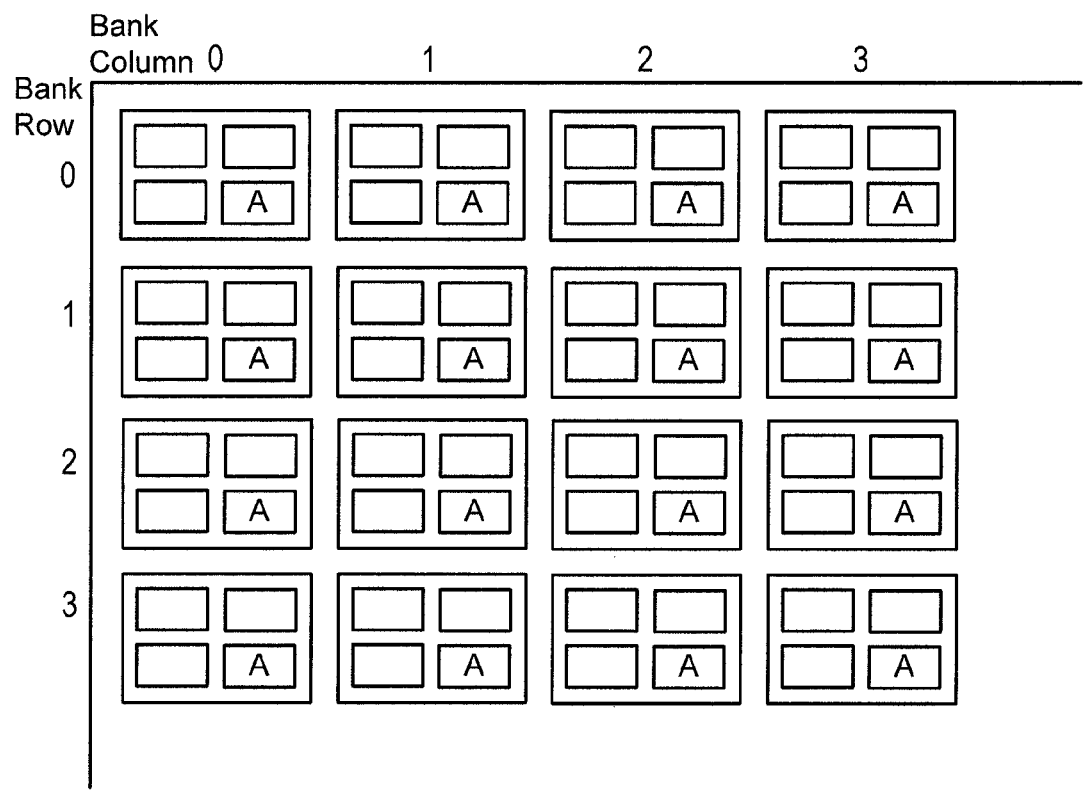
FIGS. 9A-9C illustrate compression of data exhibiting some example patterns to reduce the size of a configuration bitstream consistent with some embodiments of the present invention.

The written pattern illustrated in FIG. 9A, with data A shown written into the SE block of each of banks 230, can be written by setting the mode MOD to '11,' setting block select to the SE block, and writing the data A into memory 120. Under those conditions, data A is simultaneously written into each of the memory cells indicated by column select 308 and intra-block location 310 in all of SE blocks in each of banks 230 in memory array 200.

Figure 9B:
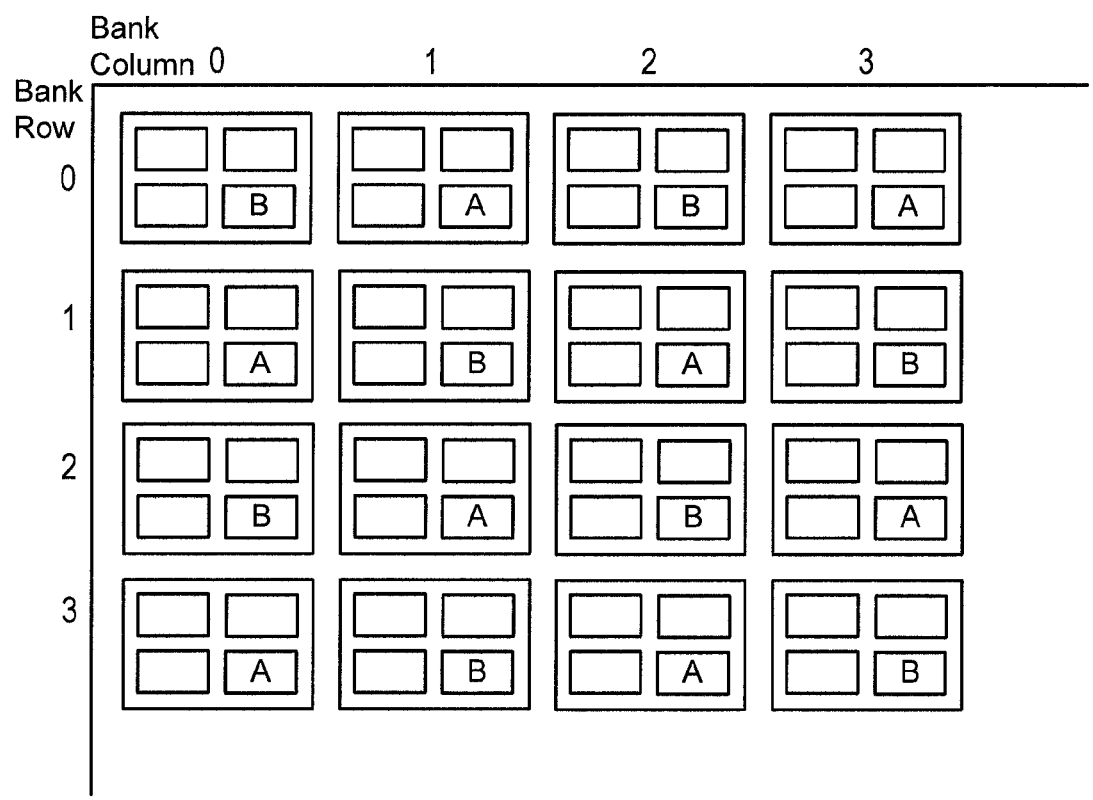

The written pattern illustrated in FIG. 9B includes data A and data B written bank checkerboard pattern in the SE block. This pattern can be written in two steps. In step 1, the mode MOD is set to '10,' the pattern indicator bit is set to select the odd number, setting block select 308 to the SE block, and writing data A into the location indicated by column select 308 and intra-block location 310. In step 2, the mode MOD is set to '10,' the pattern indicator bit is set to select the even numbered banks, setting the block select 308 to the SE block, and writing data B into the location indicated by column select 308 and intra-block location 310. Alternatively, the pattern shown in FIG. 9B can be written by writing either data A or data B into all SE blocks utilizing the all banks mode and then utilizing the bank checkerboard mode to write the data that was not written in the first step.

Figure 9C:
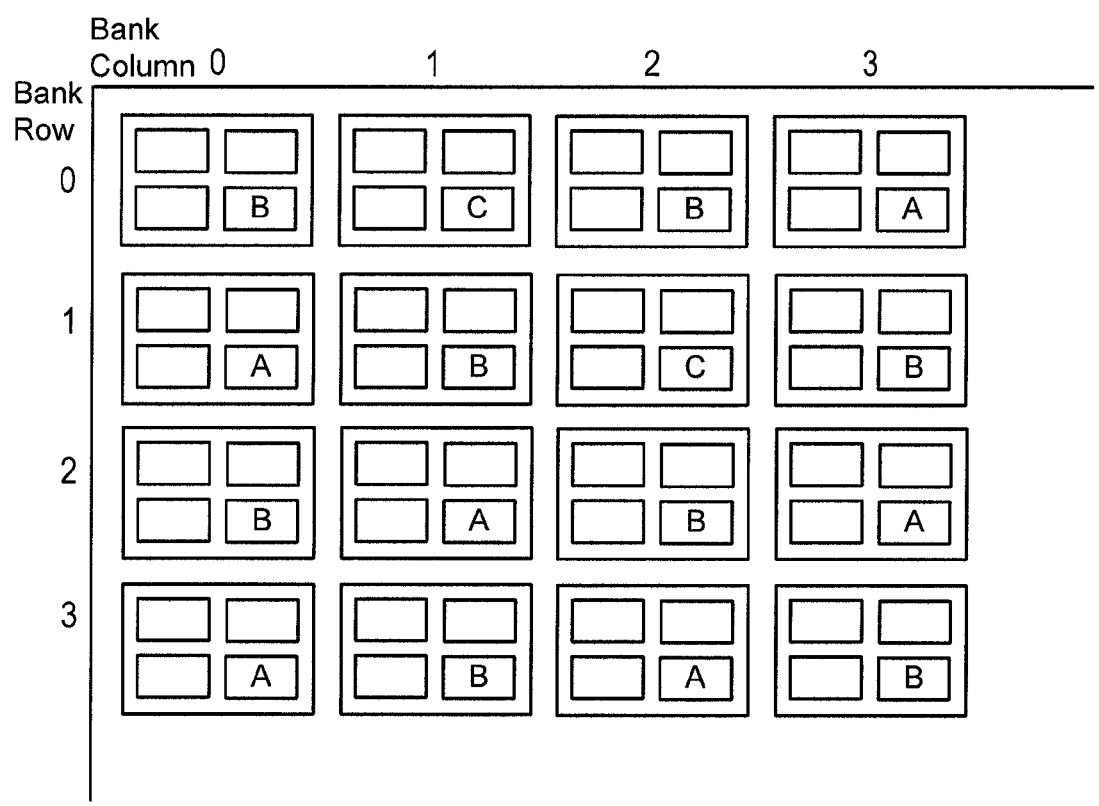

The written pattern illustrated in FIG. 9C shows data A, data B, and data C written into the SE block of each of banks 230. To achieve the data pattern illustrated in FIG. 9C, the compressed input data may be written in four steps. In step 1, mode value MOD may be set to '11' to select the all banks mode and block select 306 may be set to choose the SE block. Data A can then be written into the memory cells identified by column select 308 and intra-block location 310 into every SE block of every bank 230, as is shown in FIG. 9A. In step 2, the mode value MOD may be set to '10' to write in bank checkerboard mode, the pattern indicator bit set to choose even locations (e.g., setting bit 14 to 0), and block select 306 set to choose the SE block. Data B is then written into the memory cells indicated by column select 308 and intra-block location 310 into the pattern shown in FIG. 9B. In a third step, the mode value MOD is set to '00,' normal mode, and bank row select 302, bank column select 304, and block select 306 set to choose the SE block of the bank located at column 1, row 0. Data C is then written into the cell location of that bank indicated by column select 308 and intra-block location 310. In the fourth step, the mode value MOD is set to '00,' normal mode, and bank row select 302, bank column select 304, and block select 306 set to choose the SE block of the bank located at column 2, row 1. Data C is then written into the cell location of that bank indicated by column select 308 and intra-block location 310.

As illustrated above, the configuration of system 100 can be performed with a much compressed data stream relative to writing data individually into the memory array 200. Furthermore, compared to convention methods, in which data strings are serially written into the memory array, system 100 according to some embodiments has the ability to simultaneously write the same data into multiple memory cells, considerably shortening the total write time.

Figure 10:
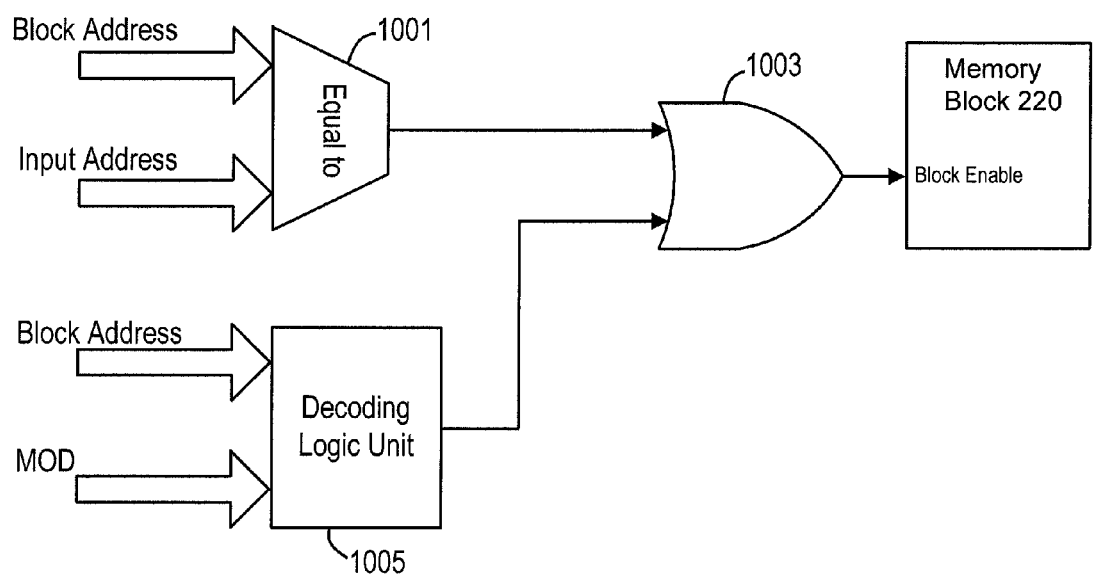
FIG. 10 shows a block diagram of a decoder consistent with some embodiments of the present invention.

FIG. 10 shows a block diagram of a decoder 1000 for a memory block 220 consistent with some embodiments of the present invention. In general, the mode values can be utilized to form wildcard bits so that an address decoder with a wildcard bit can be utilized. As shown in FIG. 10, an address comparator 1001 provides a logic bit to OR gate 1003. Address comparator can receive bank row select 302, bank column select 304, and block select 306 and compare that address with the block address identifying the particular block 220. Additionally, a wildcard bit from a decode logic unit 1005 is also provided to OR gate 1003. In that fashion, a memory block is enabled when the block address is equal to the address applied to the memory or when the wildcard bit is enabled. Conventionally, a memory block would be enabled only when the addresses match.

In the embodiment shown in FIG. 10, memory block decoder 1000 includes decoding logic unit 1005. Decoding logic unit 1005 receives the mode value MOD and determines the value of the wildcard bit to OR gate 1003 accordingly. FIG. 11 shows a logic table executed by decoding logic unit 1005 that is consistent with the mode values outlined in FIG. 4 and the block layout illustrated in FIG. 2. The decoding logic unit 1005 uses the values of the mode MOD to determine whether the individual block 220 should be enabled in accordance with the pattern identified by the mode value. As shown in FIG. 11, mode bits 1 and 2 and the pattern indicator bit (either bit 12 or 14) result in a different logic output in each of the eight blocks (even or odd plus NW, NE, SW, and SE).

In the table shown in FIG. 11, blocks NW, NE, SW, and SE can be identified by block select values 00, 01, 10, and 11, respectively. The logic output of decoding logic unit 1005 for the particular one of memory block 220 is indicated by the type of memory block. Depending on the mode MOD and the input address ADD, the decoding logic unit may send a pattern enable signal to enable none, one, two, or four block groups. For example, when mode is '01' and bit 12 of the input address ADD is 0, enable signals are sent to block groups odd-bank SW, odd-bank NE, even-bank SW, and even-bank NE. Also, when mode is 11 and block select of the input address is NW, then enable signals are sent to block groups odd-bank NW and even-bank NW. In some embodiments, decoding logic unit 1005 may be coupled to either pattern enable lines coupled to provide wildcard enable signals to decoder circuits coupled to each of the memory blocks 220. In some embodiments, each of memory blocks 220 includes a decoding logic unit 1005 providing a wildcard enable signal.

The logic table shown in FIG. 11 is an illustrative example. Other logic tables and pattern enable line configurations are possible to implement the modes listed in FIG. 4. For example, each of the banks could have an enable line, and the six, instead of eight pattern enable lines could be utilized: odd and even banks enable, and NW, SW, SE, and NE blocks enable. The logic table may also vary depending on the modes and the patterns designs of different embodiments. Further, in some embodiments one decode logic unit 1005 may be coupled to each of the eight block types so that decode logic unit 1005 provides eight different wildcard values, one for each of the eight block types.

As discussed above, some embodiments of the present invention allow input data DAT to be transmitted in configuration bitstream in compressed form. A software algorithm may optimize the uncompressed input data mapping according to the patterns of the predetermined modes to minimize the size of the compressed input data. As long as the granularity of the input data is reasonably large, the overhead of inserting mode values into the compressed data is insignificant. The decode and write time of the disclosed embodiments is also considerably shortened because multiple blocks are written into simultaneously.

Figure 12:
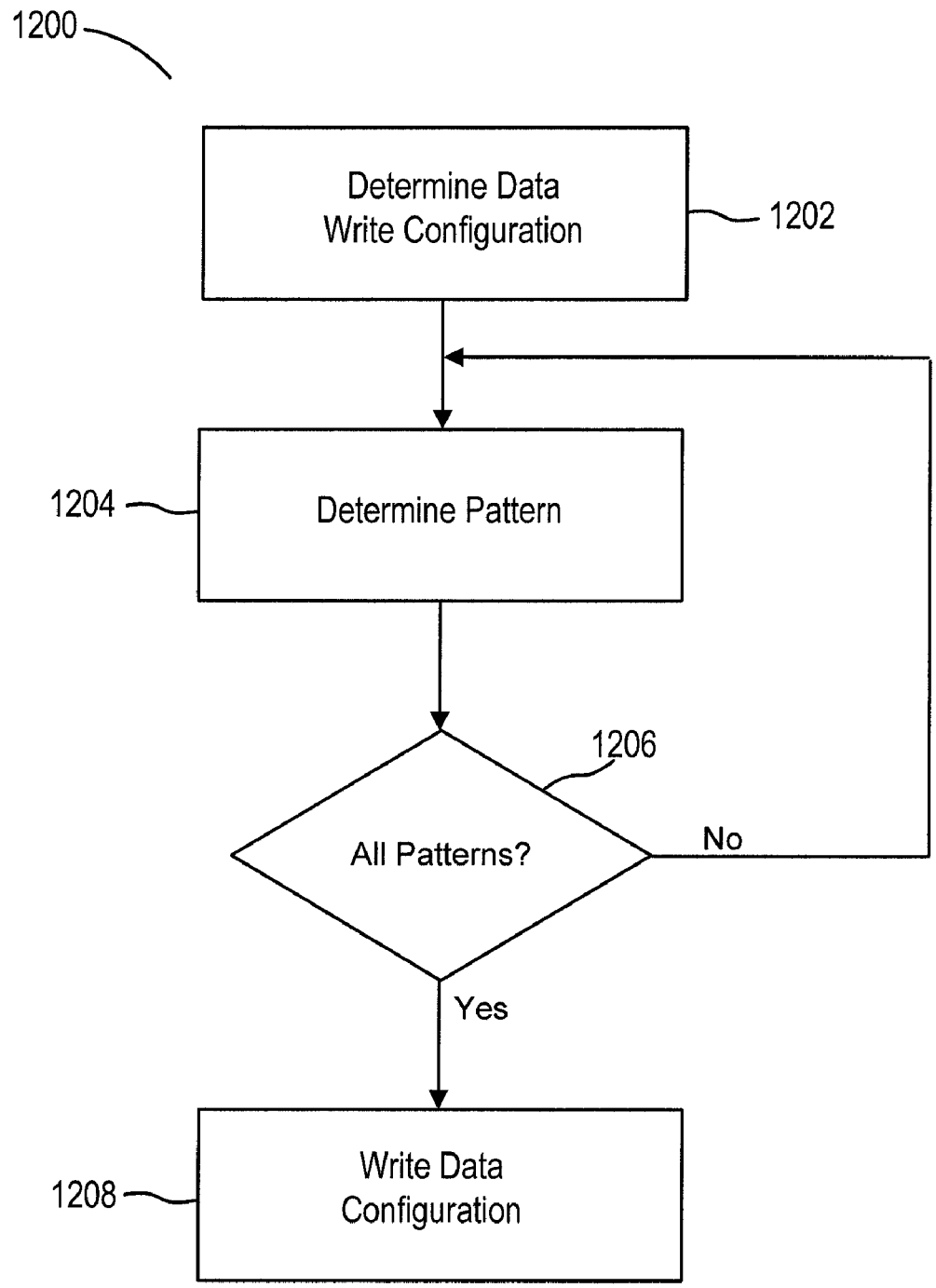
FIG. 12 illustrates a process for writing data into a configuration memory according to some embodiments of the present invention.

FIG. 12 illustrates a process 1200 to write data into a memory 120 according to some embodiments of the present invention. As shown in FIG. 12, first the configuration is determined. In this fashion, data that is to be written into memory 120 is determined. In some embodiments, the data may be compiled with a determination of what data DAT is to be written into which memory locations in memory 120. In step 1204, patterns from the list of available modes are determined. In some embodiments, each mode pattern is tested against the compiled data to determine a set of pattern writes that will accomplish the data configuration determined in step 1202. In step 1206, each of the mode patterns may be tested. In step 1208, configuration bitstream 150 is stored in memory 140 and, from there, data DAT is loaded into memory 120 as described above.

Although embodiments according to the following invention can be utilized for other purposes, especially where data is likely to be written into patterns in memory 120, one implementation that benefits from the advantages of some embodiments according to the present invention is a configuration memory array in a field programmable gate array (FPGA) devices, which is shown in FIG. 1. FPGAs generally contain a configuration memory which stores a user configured bitstream. When the configuration memory is a volatile memory, the bitstream may be loaded through software before each session, or the bitstream may be stored on another non-volatile memory on the FPGA device, such as memory 140. Increased size of the non-volatile memory increases cost, therefore,. although a large bitstream size is often preferred, the maximum allowable size of the bitstream influences the economical feasibility of the device. The disclosed embodiments allows a non-volatile memory to store a compressed bitstream that is larger than the memory's maximum capacity when decoded, thereby reducing the cost associated with a larger non-volatile memory. Some embodiments also reduce the load time when bitstream 150 is transferred from non-volatile memory 140 to configuration memory 120.

Some embodiments of the present invention also confer advantages in the silicon testing of a field programmable logic. During FPGA testing, tens of bitstreams are loaded into configuration memory (volatile or non-volatile) in order to achieve sufficient reasonable test coverage. The cost of testing is affected by the test time and the memory requirement, both of which are effected by the size of input bitstream 150. Compressing input bitstream 150 and utilizing simultaneous writes in memory 120 can significantly reduce the transfer time and thereby reduce the time and cost of testing.

The embodiments of the invention described here are exemplary only and are not intended to limit the scope of the invention. One skilled in the art may recognize various modifications to the embodiments specifically described. These modifications are intended to be within the scope of this disclosure. As a result, the invention is limited only by the following claims.

We claim:

1. A memory, comprising:
a memory array including a plurality of memory banks, each memory bank including at least one memory block, each of the at least one memory block including an array of memory cells;
an address decoder coupled to each of the at least one memory block, the address decoder including
a comparator coupled to receive an input address and a block address and provide a compare bit that indicates when a portion of the input address matches the block address, and
an OR gate coupled to receive the compare bit and a wildcard bit, the OR gate providing an enable to the memory block when either the compare bit or the wildcard bit is asserted; and
a logic unit that receives a mode value and the input address and provides the wildcard bit to each of the address decoders,
wherein data can be simultaneously written into the memory array in patterns in accordance with the mode value.

2. The memory of claim 1, wherein the portion of the input address and the block address each include a bank row select, a bank column select, and a block select field, wherein the bank row select determines a row location of a particular memory bank, the bank column select determines a column location of the particular memory bank, and the block select determines a particular memory block within the particular memory bank.

3. The memory of claim 2, wherein the input address further includes a cell address to determine a particular cell within the particular memory block.

4. The memory of claim 3, wherein the cell address includes a column select and an intra-block location.

5. The memory of claim 3, wherein the at least one memory block includes four blocks arranged in a 2×2 array, the 2×2 array of blocks being designated NW, NE, SW, and SE.

6. The memory of claim 5, wherein the mode value indicates one of a plurality of modes indicating a pattern of simultaneous writes.

7. The memory of claim 6, wherein the mode value indicates one of four patterns, a normal pattern, a block checkerboard pattern, a bank checkerboard pattern, and an all banks pattern.

8. The memory of claim 7, wherein in normal mode data is written into memory locations identified by the input address.

9. The memory of claim 7, wherein in block checkerboard mode, the bank row select, the bank column select, and the block select are ignored, a bit from one of the bank row select, the bank column select, and the block select is designated as a pattern indicator bit, and wherein either the SW and NE blocks are written to or the SE and NW blocks are written to depending on the pattern indicator bit.

10. The memory of claim 7, wherein in bank checkerboard mode, the bank row select and bank column select are ignored and a bit from the bank row select and the bank column select is designated as a pattern indicator bit, and wherein either all banks with even designations or all banks with odd designations are written to at location determined by the block select and the cell address, depending on the pattern indicator bit.

11. The memory of claim 7, wherein in all banks mode, the bank row select and bank column select are ignored and data are written into all locations identified by the block select and the cell address.

12. A method of writing to a memory array, comprising:
receiving a data value, an input address, and a mode value; and
simultaneously writing the data value into memory cells of the memory array in patterns according to the mode value and the input address;
wherein for at least one mode value, the input address is interpreted not as specifying a single memory cell but as specifying a plurality of memory cells at different addresses, for writing the data value into each of the memory cells at the different addresses.

13. A method of writing to a memory array, comprising:
receiving a data value, an input address, and a mode value; and
simultaneously writing the data value into memory cells of the memory array in patterns according to the mode value and the input address;
wherein the memory array includes a plurality of memory banks and at least one memory block within each of the plurality of memory banks, the input address includes a bank row select, a bank column select, a block select, and a cell location, wherein the bank row select and the bank column select identify a particular memory bank within the plurality of memory banks, the block select determines a particular memory block within the particular memory bank, and the cell location determines a cell within the particular memory block.

14. The method of claim 13, wherein the mode value determines a pattern from a set of patterns for writing into the memory array.

15. The method of claim 14, wherein the at least one memory bank includes four memory blocks, and the mode value includes four modes.

16. The method of claim 15, wherein the four modes includes a normal mode where data is written into memory locations identified by the input address.

17. The method of claim 15, wherein the four modes includes a block checkerboard mode, where the bank row select, the bank column select, and the block select are ignored, a bit from one of the bank row select, the bank column select, and the block select is designated as a pattern indicator bit, and wherein either the SW and NE blocks are written to or the SE and NW blocks are written to depending on the pattern indicator bit.

18. The method of claim 15, wherein the four modes includes a bank checkerboard mode, where the bank row select and bank column select are ignored and a bit from the bank row select and the bank column select is designated as a pattern indicator bit, and wherein either all banks with even designations or all banks with odd designations are written to at location determined by the block select and the cell address, depending on the pattern indicator bit.

19. The method of claim 15, wherein the four modes includes an all banks mode, where the bank row select and bank column select are ignored and data are written into all locations identified by the block select and the cell address.

20. A method of configuring a field programmable gate array, comprising:
compiling a configuration of the field programmable gate array;
determining one or more patterns corresponding to a plurality of modes from the configuration;
determining a configuration bitstream utilizing the patterns; and
writing the configuration into a memory of the field programmable gate array according to the one or more patterns.

21. The method of claim 20, further including storing the configuration bitstream in a non-volatile memory.

22. The method of claim 20, wherein the memory is partitioned into banks, with each bank including one or more blocks of individual cells and the plurality of modes includes a normal mode, a block checkerboard mode, a bank checkerboard mode, and an all banks mode.

23. The method of claim 20, wherein writing the configuration into memory includes
receiving the configuration bitstream,
determining a mode value, and address, and data from the configuration bitstream;
writing the data into the memory in a pattern determined by the mode value, at cell locations determined by the address.

24. A memory comprising:
a plurality of memory cells;
circuitry for receiving a data value, an input address, and a mode value, and simultaneously writing the data value into each of one or more memory cells specified by the mode value and the input address;
wherein the input address is interpreted in accordance with the mode value to specify the one or more memory cells into which the data value is written; and
for at least one mode value, the input address is interpreted not as specifying a single memory cell but as specifying a plurality of memory cells at different addresses.

25. The memory of claim 24 wherein for at least one mode value, the input address is interpreted as specifying a single memory cell.

26. The memory of claim 24 wherein for said at least one mode value, the input address is interpreted as specifying a repeating pattern of memory cells which repeats throughout the plurality of memory cells.

27. The memory of claim 26 wherein:
the memory comprises a plurality of memory blocks, each memory block comprising a plurality of locations having respective different addresses, each location comprising one or more of said memory cells; and
the repeating pattern is defined by a repeating pattern of the memory blocks.

* * * * *